(12) United States Patent
Conte et al.

(10) Patent No.: US 7,122,100 B2
(45) Date of Patent: Oct. 17, 2006

(54) POROUS GETTER DEVICES WITH REDUCED PARTICLE LOSS AND METHOD FOR MANUFACTURING SAME

(75) Inventors: Andrea Conte, Milan (IT); Marco Moraja, Milan (IT)

(73) Assignee: SAES Getters S.p.A.(IT)

( * ) Notice: Subject to any disclaimer, the term of this patent is extended or adjusted under 35 U.S.C. 154(b) by 285 days.

(21) Appl. No.: 10/871,353

(22) Filed: Jun. 18, 2004

(65) Prior Publication Data

US 2005/0023134 A1    Feb. 3, 2005

Related U.S. Application Data

(63) Continuation of application No. 10/389,382, filed on Mar. 14, 2003, now Pat. No. 6,783,696, and a continuation of application No. 09/967,234, filed on Sep. 27, 2001, now Pat. No. 6,620,297.

(30) Foreign Application Priority Data

Sep. 27, 2000   (IT)   ................ MI2000A2099

(51) Int. Cl.
  C23C 14/16   (2006.01)
  C23C 14/48   (2006.01)
  B22F 3/11    (2006.01)
(52) U.S. Cl. .............. 204/192.11; 204/192.12; 204/192.15; 204/192.38; 427/528; 427/531; 419/2
(58) Field of Classification Search ............ None
  See application file for complete search history.

(56) References Cited

U.S. PATENT DOCUMENTS

| | | | |
|---|---|---|---|
| 2,491,284 A | 12/1949 | Sears |
| 3,022,187 A | 2/1962 | Eyraud et al. |
| 3,926,832 A | 12/1975 | Barosi |
| 4,428,856 A | 1/1984 | Boyarina et al. |
| 5,242,559 A | 9/1993 | Giorgi |
| 5,456,740 A | 10/1995 | Snow et al. |
| 5,882,727 A | 3/1999 | Corazza et al. |
| 5,908,579 A | 6/1999 | Conte et al. |
| 5,961,750 A | 10/1999 | Boffito et al. |
| 6,559,596 B1 | 5/2003 | Arai et al. |
| 6,620,297 B1 | 9/2003 | Conte et al. |
| 6,783,696 B1 | 8/2004 | Conte et al. |

FOREIGN PATENT DOCUMENTS

| | | |
|---|---|---|
| FR | 1 132 524 | 3/1957 |
| WO | WO 00/07209 | 2/2000 |
| WO | WO 00/10643 | 3/2000 |
| WO | WO 00/75950 A1 | 12/2000 |

*Primary Examiner*—Matthew A. Thexton
(74) *Attorney, Agent, or Firm*—TIPS Group

(57) ABSTRACT

A method for reducing the loss of particles from the surface of porous getter bodies is taught herein. The method consists in producing on the surface of the porous getter a thin layer of a metal or metal alloy with a deposition technique selected among the deposition of materials from arc generated plasma, ionic beam deposition and cathodic deposition. The deposition technique allows for granular or columnar surface of the covering material but still allowing access to the surface of the getter material, resulting in a reduced getter particle loss.

20 Claims, 3 Drawing Sheets

POROUS GETTER DEVICES WITH REDUCED PARTICLE LOSS AND METHOD FOR MANUFACTURING SAME

CROSS REFERENCE TO RELATED APPLICATIONS

This application claims priority under 35 USC 120 to and is a continuation of U.S. application Ser. No. 10/389,382 filed Mar. 14, 2003, now U.S. Pat. No. 6,783,696, which is incorporated herein in its entirety by reference and U.S. application Ser. No. 09/967,234 filed Sep. 27, 2001, now U.S. Pat. No. 6,620,297, issued Sep. 16, 2003 also incorporated by reference which claims priority under 35 USC 119 to Italian patent application MI-2000-A-002099, filed Sep. 27, 2000, which is also incorporated by reference herein for all purposes.

FIELD OF THE INVENTION

The present invention relates to a reduced particle loss porous getter devices and the method for manufacturing such reduced particle loss getter devices.

BACKGROUND OF THE INVENTION

Getter devices can be used in all the technological and scientific applications wherein vacuum maintenance is required, such as, for example, flat displays (of the plasma or field emission type), some kind of lamps or particle accelerators for scientific research. Another important field of use of the getter devices is gas purification, inside fluorescent lamps but mainly in the case of the process gases for microelectronic industry.

The active materials which form these getter devices are mainly zirconium and titanium and alloys thereof with one or more elements selected from among the transition elements and aluminum. Such materials have a strong ability to absorb gases of low molecular weight, such as oxygen, water, hydrogen, carbon oxides and in some cases nitrogen, and therefore are used for removing traces of these gases from spaces where the vacuum must be maintained, or remove such gases from atmospheres or flows of gases which are inert towards these materials, mainly noble gases.

Since gas sorption takes place through the surface of the getter material, it is generally preferable that such as surface as wide as possible. In order to obtain this result, while maintaining small device size, porous devices are generally used. The porous devices are formed of consolidated powders of getter materials which allow a high ratio of exposed surface of active material to the geometrical surface of the getter device.

Various methods for manufacturing porous getters devices are described in the literature. For example, Great Britain patent GB-B-2,077,487 describes the production of porous getter devices formed of a mixture of powders of a getter metal, particularly titanium or zirconium, with a getter alloy; the mixture is precompressed and sintered in a vacuum oven at temperatures between approximately 800 and 1100° C. The getter alloy, which has a sintering temperature higher than that of the metal, is added to provide the antisintering function, in order to avoid an excessive compaction of the powders with following reduction of the gas sorption features. Patent application DE-A-2,204,714 discloses a process similar to that of the cited patent GB-B-2,077,487, with the difference that in this case graphite powder is used as an antisintering agent.

Getter devices having a porosity degree higher than those obtained by the two previously described techniques can be manufactured by the electrophoretic technique, described in U.S. Pat. No. 5,242,559 to Ettore, which is incorporated herein by reference in its entirety. According to this technique, a suspension, generally hydroalcoholic, of particles of a getter material is prepared. In the suspension are inserted two electrodes one of which, made of metal or graphite, will also serve as a support of the final getter device. The transport of the getter material particles towards the support and their adhesion thereon is caused by applying a potential voltage difference between the two electrodes. The deposit obtained is then consolidated by a sintering thermal treatment in a vacuum oven, generally at temperatures ranging between about 900 and 1000° C.

Getter devices wherein the active material is in the form of a layer on a planar support can be produced by the screen-printing technique, which is described in U.S. Pat. No. 5,882,727, to Corazza, et. al., and which is herein incorporated by reference in its entirety. According to this screen-printing technique, a paste of getter material particles is prepared in an aqueous solution containing low percentages of an organic compound having a high boiling point, which acts as a binder. This paste is passed through the meshes of a suitable net, and is deposited on the underlying substrate. The deposit is then dried and consolidated by sintering in a vacuum oven at a temperature between about 800 and 1000° C.

Finally, getter devices having a particularly high porosity degree can be obtained according to the technique described in U.S. Pat. No. 5,908,579 to Conte, et. al., which is herein incorporated by reference in its entirety. The technique taught in this patent uses a mixture of powders of the getter material and of an organic component, for example ammonium carbamate. The organic component evaporates during the thermal treatments of the consolidation of the getter device. Such treatments generally reach temperatures between 900 and 1200° C., and leave a net of interconnected porosities or micropassages which allow the access of gases to the surface of the innermost particles of getter material in the device.

A problem encountered with the getter devices according to the above-described known art is the possibility of the loss of particles due to the fact that the surface particles of the getter tend to be bound more weakly than the internal particles. The presence of free particles is painful for most of the anticipated applications of the getter devices, because such free particles may interfere with the functionality of the device. One example is the case of flat displays. In other examples, such freed particles may come between the path of radiations or elementary particle beams (such as applications in particle accelerators) or the free particles may deposit on microelectronic devices which are being manufactured.

A possible solution to this problem is to increase the sintering temperature, thus favoring the mutual adhesion of the particles. However, this method not only reduces the entity of the particle loss problem without solving it, but also has the disadvantage that it leads to a reduction of the porosity and of the exposed area of the active material, which results in a reduction of the gas sorption properties of the getter devices.

What is needed is a method by which porous getter devices can be manufactured increasing the adhesion of particles without increasing the sintering temperature and the associated negative effects in the reduction of porosity.

SUMMARY OF THE INVENTION

The present invention solves the above discussed problems by including a reduced particle loss porous getter device and a method for manufacturing such a getter device. This method includes producing on the surface of the porous getter body a deposit of thickness of at least 0.5 µm of a material compatible with the conditions of use foreseen for the getter device, with a technique selected among the deposition techniques of: deposition of materials from arc generated plasma, deposition from ionic beam, and cathodic deposition.

The present invention uses the discovery that the deposition of a suitable material in low thickness on the surface of a porous getter body does not prejudice the gas sorption properties, and sensibly reduces the phenomenon of particle loss at the same time. This discovery is in contrast to what was originally thought by many of those skilled in the art regarding deposition materials on a porous getter body.

The present invention is also particularly useful for the manufacture of a particular type of getter device, having the shape and size of a substrate to be treated in a deposition chamber such as in a process chamber of the microelectronic industry, wherein the getter device guarantees a lower evacuation time and a better cleaning of the working atmosphere: this kind of getter device is described in international patent application PCT/IT00/00136 in the name of the applicant.

These and other advantages of the present invention will become apparent upon reading the following detailed descriptions and studying the various figures of the drawings.

DETAILED DESCRIPTION OF THE INVENTION

Figure 1:
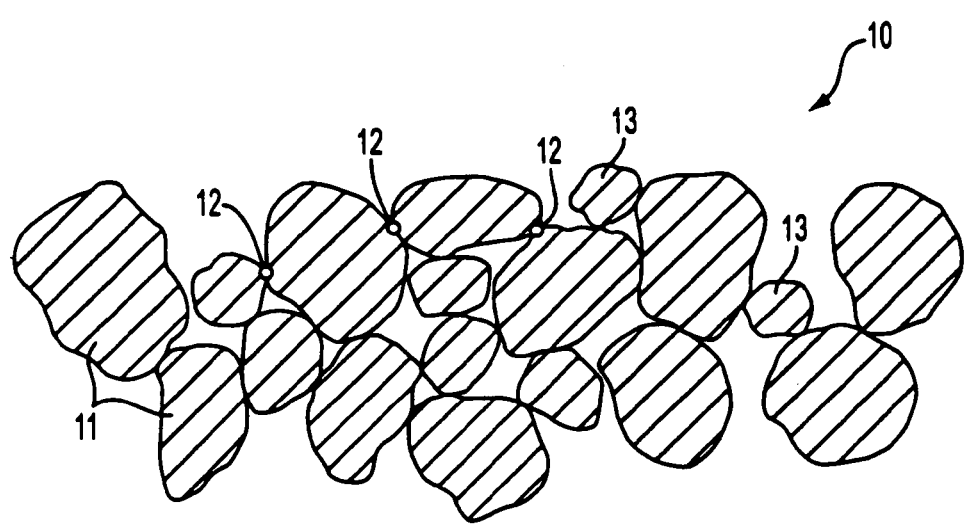
FIG. 1 shows schematically a cross-sectional view of a porous getter body before the covering according to the method of the invention.

Referring now to FIG. 1, a cross-section of the surface portion of a porous getter body 10 is shown. The particles of getter material 11 are connected together through "necks" 12, wherein during the sintering process, microfusions of the material 11 take place. The adhesion of the surface particles to the rest of the structure can be reduced because of a scarce mechanical resistance of these necks (due to a low temperature of the sintering process) or to their reduced number, in particular in the case of particles 13 of a small size.

Figure 2:
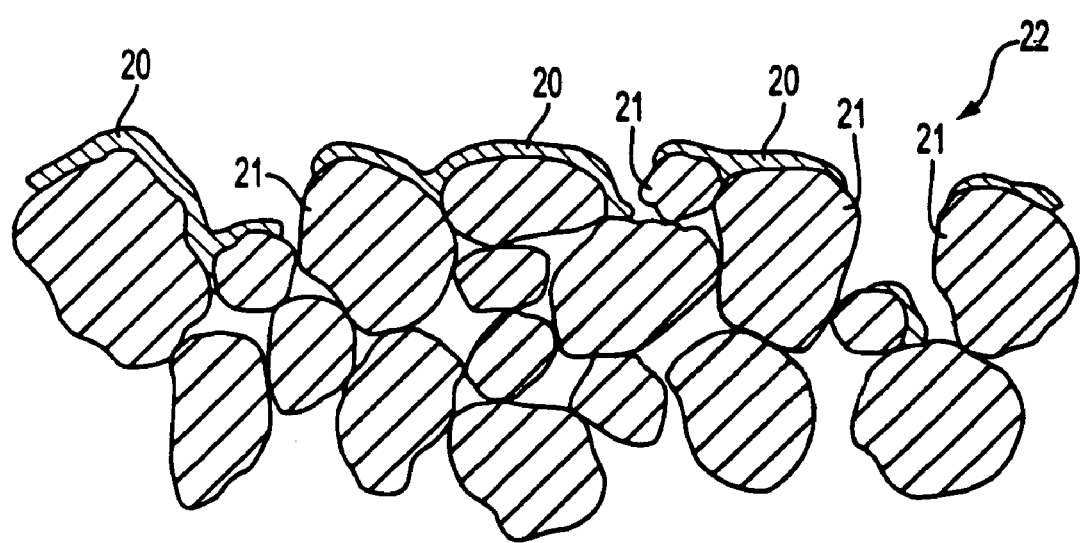
FIG. 2 shows the same cross-section of the porous getter body of FIG. 1 after the covering with a deposit material according to the method of the invention.

FIG. 2 represents the same body of FIG. 1 with a covering according to the method of the present invention. The upper surface of body 10 is covered with a layer 20 obtained by one of the cited techniques, which will be detailed below. These techniques are directional, and as such, the deposit 20 covers only the portion of body 10 which is exposed towards the source of the material which is to be deposited. Some zones 21 of the surface getter particles, which are in the "shadow area," or area in which the direction of deposition of the material of layer 20 that it will remain free from the deposited material. In FIG. 2, the "shadow areas" tend to be perpendicular to the direction of deposition, or "underneath" other sections of the particle which block it. The total effect is that deposit 20 acts as a glue of the surface particles, but it does not clog the large channels among getter material particles. Without such clogging gasses are allowed to access towards the innermost particles. Because the surface of the innermost particles is not covered in the method according to the invention it therefore remains active and available for the gas sorption. The result is a porous getter body 22 superficially covered by the deposit 20.

The porous getter body 10 on which the deposit 20 is formed to create the covered porous getter body 22, can be produced according to any one of the previously mentioned techniques, that is powder compression with or without organic components which evaporate during the subsequent thermal treatments, electrophoresis and screen-printing.

The getter materials which can be used for the production of the porous body are various, and generally comprise titanium and zirconium metals, their hydrides, titanium or zirconium alloys with one or more elements selected among transition elements and aluminum, and mixtures of one or more of these alloys with titanium and/or zirconium or their hydrides. Among the most useful materials for the purposes of the invention which can be identified are the alloys: Zr—Al described in U.S. Pat. No. 3,203,901 to della Porta, which is herein incorporated by reference, and more particularly the alloy having a composition of Zr 84% Al 16% by weight, which is produced and sold by the applicant under the trade name St101; Zr—V—Fe described in U.S. Pat. No. 4,312,669 to Boffito, et, al, which is herein incorporated by reference in its entirety, and more particularly the alloy having the composition Zr 70% —V 24.6% Fe 5.4% by weight, which is also produced and sold by the applicant under the trade name St 707; Zr—Co—A, wherein A indicates an element selected among yttrium, lanthanum, Rare Earths or mixtures thereof described in U.S. Pat. No. 5,961,750 to Boffito, et. al., which is herein incorporated by reference, and more particularly the alloy having a composition of Zr 80.8%- Co 14.2%—A 5% by weight, which is also manufactured and sold by the applicant under the trade name St 787; Ti—V—Mn disclosed in U.S. Pat. No. 4,457,891, which is incorporated herein by reference; the mixture comprising, by weight, 70% of Ti and 30% of alloy St101; the mixture comprising 70% of Ti and 30% of alloy St 707; the mixture comprising 40% of Zr and 60% of alloy St 707; the mixture comprising 60% of Ti and 40% of alloy St 707; and the mixture comprising, by weight, 10% of Mo, 80% of Ti and 10% of $TiH_2$, which is described in U.S. Pat. No. 4,428,856 to Boyarina, et. al., which is incorporated herein by reference, which is produced and sold by Applicant under the trade name St 175. These listed getter materials are generally employed in the form of powders of particle size lower than about 125 µm, and preferably between 20 and 100 µm.

After the manufacture of the getter body according to one of the above-listed techniques, the getter body is consolidated by means of a thermal sintering treatment under vacuum or inert atmosphere, at temperatures generally between 800 and 1200° C. depending on the materials used. The getter body obtained is then subjected to the treatment of deposition of the layer of thickness of at least 0.5 µm with a technique selected from among at least three deposition techniques: deposition from arc generated plasma, ionic beam deposition and cathodic deposition. Such techniques are well known to persons skilled in the art and are described in brief herein.

The first deposition technique, better known as definition arc plasma deposition, comprises the steps of creating microscopic drops of the material which has to be deposited by melting the surface of a solid body of the same material with a localized arc. The drops formed are then accelerated towards the substrate which has to be covered. The technique enables compact coverings to be obtained quickly, and is used for example for covering mechanical tools in order to improve the hardness features thereof.

The present invention may also use the deposition technique of deposition from an ionic beam, better known with the ion beam deposition. Ion beam deposition creates a plasma of ions of the material to be deposited, and then accelerates these ions towards the substrate to be covered by means of an electric field.

Although the present invention may use the above-listed methods, in a preferred embodiment, the present invention uses the cathodic deposition technique. The cathodic deposition technique allows the production of thin layers of thickness values generally up to about 10–20 µm, of a material on a support generally formed of a different material. The technique has a large number of variants, and is better known in the field with the techniques of "sputtering" (which will be used in the rest of the text) or "physical vapor deposition" or its acronym "PVD". The sputtering technique is widely known to those skilled in the art and used extensively in many industries. Sputtering is particularly prevalent in the microelectronics industry, since sputtering allows the production of thin layers of active materials (for example, layers of conductor materials) or with a passive functionality (insulators, for example), but has also an application in a number of other fields, such as manufacturing the layer of aluminum in the compact disc.

These sputtering techniques and variations thereof are numerous and well-known to those skilled in the art, and therefore do not need to be described in detail to allow one to practice the present invention. However, in order to understand the invention it is sufficient to recall the basis of the technique. The sputtering technique is used a vacuum chamber wherein it is possible to generate an electric field. In the chamber are placed a target of the material which is to be deposited (generally having the shape of a short cylinder) and, in front of the target, the support on which the thin layer is to be formed. The chamber is first evacuated and then filled with an atmosphere of a noble gas, generally argon, at a pressure of $10^{-2}$–$10^{-5}$ mbar. By applying a potential difference of a few thousands of volts between the backings of the support and of the target (so that the latter is at cathode potential) a plasma of electrons and $Ar^+$ ions is generated. These ions are accelerated by the electric field towards the target thus causing impact erosion on the target. The species (generally atoms or "clusters" of atoms) derived from the erosion of the target deposit on the support forms the thin layer. By varying the process parameters, the properties and the conditions of the film manufacturing can be controlled. For example, by increasing the power applied at the electrodes, the thickness produced in the same amount of time is increased and the morphology of the thin layer obtained from the process is changed. Additionally, the morphology can be controlled in a more efficient way by varying the incident angle of deposition with respect to the substrate.

The thickness of the layer deposited by sputtering on the surface of the porous getter must be at least 0.5 µm, because at lower thickness values the cohesion of the layer is not sufficient for retaining the particles of getter material which may not be tightly bound to the rest of the device. Even if an upper limit for the thickness of the layer does not technically exist, for practical purposes it is generally lower than 5 µm, because for higher thickness values there are long processing times without obtaining particular advantages. In a preferred embodiment the thickness of the deposit is between 1 and 2.5 µm.

The material for forming the deposit can be any material compatible with the anticipated conditions of use of the device in the final application. In particular, the material of the deposit must have a low gas release and must be able to withstand the temperatures to which the getter device is subjected during the manufacturing processes in which the getter devices are used without alterations. An example would be the fritting operations for sealing flat displays or lamps; in the case of the devices having shape and size of the substrates to be treated in a deposition chamber, described in the above cited international patent application PCT/IT00/00136, the material deposited on the porous getter body must be able to withstand the heating at the activation temperature of the getter material, and at least at temperatures around 500° C. to which the chamber is subjected, in order to degas the walls. The deposited material can be selected among transition metals, Rare Earths and aluminum. It is also possible to deposit more than one metal at a time with the so-called "co-sputtering" techniques, which results in mixtures or alloys of the cited metals.

In a preferred embodiment, the deposited material is a metal also having getter properties. These materials will include materials such as vanadium, niobium, hafnium, tantalum, or in a preferred embodiment: titanium and zirconium, or alloys of these metals.

Figure 3:
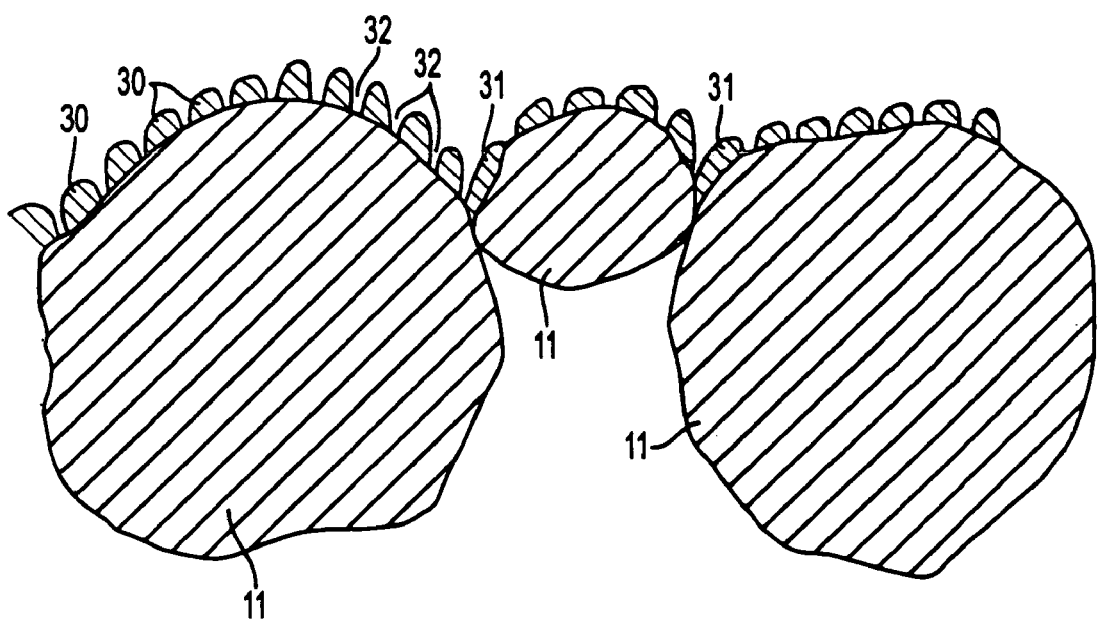
FIG. 3 shows the cross-section of a few grains of getter material covered with a columnar or granular morphology according to a preferred embodiment of the method of the invention.

In the case of the deposition by sputtering techniques of one of these materials in a preferred embodiment, not only is there reduced particle loss, but the gas sorption properties are increased when compared to the porous getter bodies which are not covered. Particularly good results are obtained if the layer deposited by sputtering has granular or columnar morphology. An illustration of the surface of a porous getter body covered with a deposit having the granular or columnar morphology is represented by FIG. 3, which shows superficial getter grains 11 covered by a multiplicity of microdeposits 30. The microdeposits 30 are able to carry out the function of a glue for the grains at contact areas 31, but within which are microchannels 32. These microchannels 32 improve the accessibility of the gases to the underlying porous getter material 13, and also to the surface of the same covered getter grains 11.

The granular or columnar morphology can be obtained by controlling the deposition conditions. In a preferred embodiment, this is accomplished particularly by operating at high pressure of the noble gas and at low temperature of the substrate (i.e. the porous getter). In a preferred embodiment, the gas pressure is maintained between about $1\times10^{-3}$ and $5\times10^{-2}$ mbar, and the temperature of the substrate is approximately room temperature.

The foregoing examples illustrate certain exemplary embodiments of the invention from which other embodiments, variations, and modifications will be apparent to those skilled in the art. The invention should therefore not be limited to the particular embodiments discussed above, but rather is defined by the following claims.

We claim:

1. A method for reducing the loss of particles of a porous getter device, comprising:
choosing a loss prevention material compatible with the conditions of use of said porous getter device;
depositing multiple discrete deposits of said loss prevention material on a surface of a porous getter body, said deposits being at least 0.5 microns thick;
wherein said depositing is completed by a deposition technique, wherein said deposition technique is one of the group consisting of: deposition from arc generated plasma, ion deposition, and cathodic deposition.

2. The method of claim 1, wherein the depositing includes covering the porous getter body with multiple microdeposits.

3. The method of claim 1, wherein the porous getter body includes superficial getter grains, wherein the deposition covers the porous getter body with multiple microdeposits, and wherein the microdeposits glue the superficial getter grains at contact areas between the superficial getter grains.

4. The method of claim 1, wherein the depositing includes superficially covering the porous getter device.

5. A method for reducing the loss of particles of a porous getter device, comprising:
choosing a loss prevention material compatible with the conditions of use of said porous getter device;
controlling conditions to obtain loss prevention material deposition having a columnar morphology;
depositing multiple discrete deposits of said loss prevention material in a columnar morphology on a surface of a porous getter body, said deposits being at least 0.5 microns thick;
wherein said depositing is completed by a deposition technique, wherein said deposition technique is one of the group consisting of: arc generated plasma deposition, ion deposition, and cathodic deposition.

6. The method of claim 5, wherein the deposition technique includes sputtering.

7. The method of claim 5, wherein the depositing includes covering the porous getter body with multiple microdeposits.

8. The method of claim 5, wherein the porous getter body includes superficial getter grains, wherein the deposition covers the porous getter body with multiple microdeposits, and wherein the microdeposits glue the superficial getter grains at contact areas between the superficial getter grains.

9. The method of claim 5, wherein the depositing includes superficially covering the porous getter device.

10. A method, comprising:
choosing a loss prevention material compatible with the conditions of use of a porous getter device;
directionally depositing said loss prevention material to cover exposed portions of said porous getter device, wherein some shadow areas remain uncovered by the directional deposition;
wherein said depositing is completed by a deposition technique, wherein said deposition technique is one of the group consisting of: arc generated plasma deposition, ion deposition, and cathodic deposition.

11. The method of claim 10, wherein said shadow areas include areas generally perpendicular to the direction of deposition.

12. The method of claim 10, wherein said shadow areas include areas underneath portions of said porous getter device that block said shadow areas from the directional deposit.

13. The method of claim 10, wherein said porous getter device includes multiple surface particles, and wherein the loss prevention material is used to glue two or more surface particles together.

14. The method of claim 10, wherein the porous getter device includes getter material particles, and wherein the directional deposition leaves large channels among getter material particles.

15. The method of claim 10, wherein the porous getter device includes surface getter material particles and inner getter material particles, wherein the directional deposition leaves channels between the surface getter material particles, and wherein the channels provide air passages to the inner getter material particles.

16. The method of claim 10, wherein the directional depositing includes superficially covering the porous getter device.

17. The method of claim 10, wherein the directional depositing includes covering the porous getter body with multiple microdeposits.

18. The method of claim 10, wherein the porous getter device includes superficial getter grains, wherein the directional deposition covers the porous getter device with multiple microdeposits, and wherein the microdeposits glue the superficial getter grains at contact areas between the superficial getter grains.

19. The method of claim 10, wherein the directional depositing includes depositing multiple discrete deposits of said loss prevention material in a columnar morphology on a surface of a porous getter body.

20. The method of claim 10, wherein the directional depositing includes depositing multiple discrete deposits of said loss prevention material on a surface of a porous getter body, said deposits being at least 0.5 microns thick.

* * * * *